United States Patent [19]

Bhagat

[11] Patent Number: 4,861,731
[45] Date of Patent: Aug. 29, 1989

[54] METHOD OF FABRICATING A LATERAL DUAL GATE THYRISTOR

[75] Inventor: Jayant K. Bhagat, Troy, Mich.

[73] Assignee: General Motors Corporation, Detroit, Mich.

[21] Appl. No.: 151,534

[22] Filed: Feb. 2, 1988

[51] Int. Cl.[4] .................................. H01L 49/00
[52] U.S. Cl. .............................. 437/51; 437/62
[58] Field of Search ............... 357/23.4, 38, 43, 55, 357/40; 437/51, 62, 228, 6

[56] References Cited

U.S. PATENT DOCUMENTS

| | | | |
|---|---|---|---|
| 3,320,485 | 5/1967 | Buie | 317/101 |
| 3,427,709 | 10/1965 | Schutze et al. | 29/580 |
| 3,579,391 | 5/1971 | Buie | 148/175 |
| 3,585,463 | 6/1971 | Richman | 317/235 |
| 3,623,218 | 11/1971 | Mitarai et al. | 29/577 |
| 3,722,079 | 3/1973 | Beasom | 29/578 |
| 3,891,866 | 6/1975 | Okuhara et al. | 307/252 A |
| 4,199,774 | 4/1980 | Plummer | 357/41 |
| 4,242,697 | 12/1980 | Berthold et al. | 437/62 |
| 4,287,526 | 9/1981 | Sakuma | 357/49 |
| 4,458,408 | 7/1984 | Alonas et al. | 357/23.4 |
| 4,593,458 | 6/1986 | Adler | 357/23.4 |
| 4,604,638 | 5/1986 | Matsuda | 357/23.4 |
| 4,605,872 | 8/1986 | Rung | 307/465 |
| 4,608,590 | 8/1986 | Hartman et al. | 357/23.4 |
| 4,611,235 | 9/1986 | Bhagat | 357/38 |
| 4,612,562 | 9/1986 | Motojima et al. | 357/23.4 |
| 4,654,691 | 3/1987 | Shirasawa et al. | 357/53 |
| 4,742,380 | 5/1988 | Chang et al. | 357/23.4 |

FOREIGN PATENT DOCUMENTS

| | | | |
|---|---|---|---|
| 2807181 | 8/1978 | Fed. Rep. of Germany | 357/22 E |
| 2524711 | 10/1983 | France | 357/43 |
| 0067580 | 6/1977 | Japan | 357/49 |
| 0115340 | 9/1980 | Japan | 437/62 |
| 0095633 | 6/1982 | Japan | 437/62 |
| 0110132 | 6/1984 | Japan | 357/49 |
| 228793 | of 1980 | U.S.S.R. | 357/38 T |

OTHER PUBLICATIONS

J. D. Plummer et al., "Insulated-Gate Planar Thyristors: I-Structure and Basic Operation," *IEEE Transactions on Electron Devices*, vol. ED-27, No. 2, Feb. 1980, pp. 380-387.

J. Tihanyi, "Functional Integration of Power MOS and Bipolar Devices," International Electron Devices Meeting, *IEDM Technical Digest*, Dec. 8-19 1980, pp. 75-78.

P. W. Shackle, "High Voltage ICs are Here," *Integrated Circuits*, Mar./Apr. 1984, p. 19+.

*Primary Examiner*—Brian E. Hearn
*Assistant Examiner*—Tom Thomas
*Attorney, Agent, or Firm*—Robert J. Wallace

[57] ABSTRACT

A semiconductor power device with bipolar regenerative switching characteristics provides insulated gate structures for controlling device turn-on and turn-off. Rapid turn-off is achieved in part by a lateral field effect pinch resistance and a vertical field effect pinch resistance produced by an electrically floating structure. The device is electrically isolated by layer of dielectric which allows it to be easily integrated with other circuit elements. The device can be controlled by low current and low positive voltages which provides for simpler interfacing and better electrical compatibility with other circuits in an automotive system. A method of manufactuing this device is also provided.

8 Claims, 2 Drawing Sheets

METHOD OF FABRICATING A LATERAL DUAL GATE THYRISTOR

RELATED APPLICATION

This is a division of application Ser. No. 931,345 filed on Nov. 17, 1986.

TECHNICAL FIELD

The present invention relates generally to semiconductor switching devices and more particularly to thyristors and their method of manufacture.

BACKGROUND ART

Microelectronic semiconductor devices are often used in current control applications, such as power switching. For the most part, semiconductor power devices have replaced mechanical relays in power switching applications. Semiconductor devices which are suitable for power switching applications include bipolar junction transistors, junction field effect transistors, insulated gate field effect transistors and, in particular, semiconductor controlled rectifiers sometimes referred to as "thyristors".

The suitability of a semiconductor power device for a particular application depends primarily on the electrical characteristics of the device and on the demands of the circuit. It may be necessary for the device to provide a specified minimum switching speed or minimum blocking voltage in order to properly function in the circuit. One important consideration in some applications is whether the device can be easily integrated with other elements of an integrated circuit. An integrated circuit or "IC" is an assembly of interconnected passive and active circuit elements formed in a crystalline "chip" of semiconductor material. Batch processing allows a large number of identical chips to be fabricated at low cost using a sequence of doping, masking and etching techniques. Both the design of a device and its fabrication sequence are important in determining its suitability for integration with other circuit elements.

Power switching in an automotive context generally involves low voltages, usually 10 to 100 volts dc, at currents of about 10 to 100 amperes. For automotive applications, it is desirable to provide a switch that can be controlled by low positive voltages and low current and which has a grounded cathode for compatibility with typical automotive circuitry. It is also desirable to provide a power switch having a low "on" resistance and high current density to reduce cost. Thyristors possess many of these attributes and thus are of interest in automotive circuit design.

Generally, thyristors have designated regions which are doped to provide a multi-layer pnpn structure. In the on-state, thyristors are characterized by regenerative transistor action. In operation, the pnpn structure of a thyristor is electrically analogous to a combination of a pnp transistor and an npn transistor. When the emitter-base junction of the pnp structure is forward biased by an appropriate voltage, the pnp transistor is turned on. The transistors are arranged such that the pnp transistor action provides holes for injection into the base of the npn transistor across the latter's emitter-base junction which is also forward biased. The hole current created by the pnp transistor action supplies base drive to the npn transistor so that the npn transistor is turned on. When the sum of the current gain alpha of the two transistors exceeds unity, regenerative switching occurs and the thyristor is "latched" on. In a gate controlled thyristor, turn-on is initiated by the action of one or more insulated gate structures.

In my prior U.S. Pat. applications, "Integrated Field Controlled Thyristor Structure with Grounded Cathode", Ser. No. 617,106, filed June 4, 1984, now U.S. Pat. No. 4,611,235; "Insulated Gate Controlled Thyristor", Ser. No. 667,845, filed Nov. 2, 1984, now U.S. Pat. No. 4,630,092; and "Insulated Gate Controlled Thyristor Having Shorted Anode", Ser. No. 667,827, filed Nov. 2, 1984, now U.S. Pat. No. 4,636,830; I disclose novel vertical thyristors having multiple insulated gate electrodes which turn the thyristors on and off. Lateral examples of such thyristors are only incidentally disclosed. These dual gate thyristors are especially suitable for electrical switching in automotive applications. Moreover, turn-off in my thyristors is achieved more readily by virtue of a junction field effect "pinch resistance" which restricts current flow to accelerate device turn-off. However, in some applications, a vertical thyristor structure may be less desirable than a lateral structure for integration with other circuit elements. Generally, the integration of control and logic devices with a vertical thyristor structure requires that these circuit elements be formed in portions of the thyristor body. However, in operation the thyristor body always has some electrical potential. That is, in both the forward-blocking state and the forward-conducting state, portions of the thyristor body are electrically charged. Therefore, when other circuit elements such as logic and control structures are formed in the thyristor body, these existing charges must be taken into consideration. Consequently, it would be desirable to provide a dual gate thyristor which is electrically isolated in a semiconductor layer such that it can be integrated with logic and control structures. I have discovered such a device.

OBJECTS AND SUMMARY OF THE INVENTION

It is an object of the present invention to provide a thyristor for integration with logic and control circuit elements in a single semiconductor layer which can be turned on by one insulated gate and turned off by a second insulated gate.

It is a further object of this invention to provide a dual-gate thyristor having low specific on-resistance characteristics of bipolar regenerative switching devices which is electrically isolated in a semiconductor body and also to provide a method for manufacturing such a thyristor.

It is still a further object of the present invention to provide a thyristor for integration with control and logic circuits which has one insulated gate structure for turning on the thyristor and another insulated gate for turning off the thyristor and in which turn-off is achieved in part by increasing the electrical resistance of designated device regions to constrain current flow.

In accordance with the present invention there is provided a thyristor which is electrically isolated from the semiconductor layer in which it resides by a buried layer of dielectric. My invention includes a laterally disposed thyristor having contiguous regions of material which form one gate for turn-on which is part of a first insulated gate field effect transistor structure and another gate for turn-off which is part of a second insulated gate field effect transistor structure. My thyristor further includes current constraining portions through which the flow of current is restricted between opposed depletion regions to produce vertical and lateral pinch resistances that accelerate device turn-off.

The present invention also comprehends a method of fabricating my novel lateral dual gate thyristor. In substance, a region of electrically isolated semiconductor material is formed from a semiconductor substrate by etching grooves into one surface of the substrate and forming a layer of N+ semiconductor material overlying the substrate surface and the groove sidewalls. The N+ layer subsequently becomes a buried layer. I then form a layer of polysilicon on the N+ layer and oxidize the polysilicon to form a layer of dielectric. After depositing a thick layer of polysilicon over the grooved surface which completely fills the grooves, the surface of the substrate opposite the grooved surface is polished until the tips of the grooves are removed past the N+ buried layer. This forms an array of dielectrically isolated regions of semiconductor material. In at least one of these islands, a centrally disposed P region is formed. A lateral ring of N+ material which encircles this P region is made along with at least one N+ strip which electrically links the N+ ring to the N+ buried layer. A cathode of N+ semiconductor material centrally disposed in the P region is provided during the step of forming the N+ ring, or optionally, the cathode can be formed in a subsequent step. Two concentric P regions are then formed, one of which serves as the anode and the other as the channel for the IGFET which is used to turn-off my thyristor. A low electrical resistance contact region is formed in the anode and then an N+ region that acts as the drain of the turn-off IGFET is formed wholly within the other concentric P region. Next, a layer of dielectric is formed on the surface of the now doped electrically isolated region and a layer of polysilicon is formed over the dielectric. The polysilicon is heavily doped with a blanket diffusion of donor impurities. The device is then patterned and metallized to form a first set of insulated gates which will capacitively connect the cathode and ring to turn the thyristor on and a second set of gates which are used to turn the thyristor off by capacitively linking the ring to the drain of the turn-off IGFET. The completed thyristor is then covered with a layer of phosphosilicate glass in which contact windows are opened and metallized accordingly.

BRIEF DESCRIPTION OF THE DRAWINGS

Other objects, features and advantages of this invention will become more apparent from the following description of the preferred embodiments thereof and from the drawings, in which.

Figure 1:
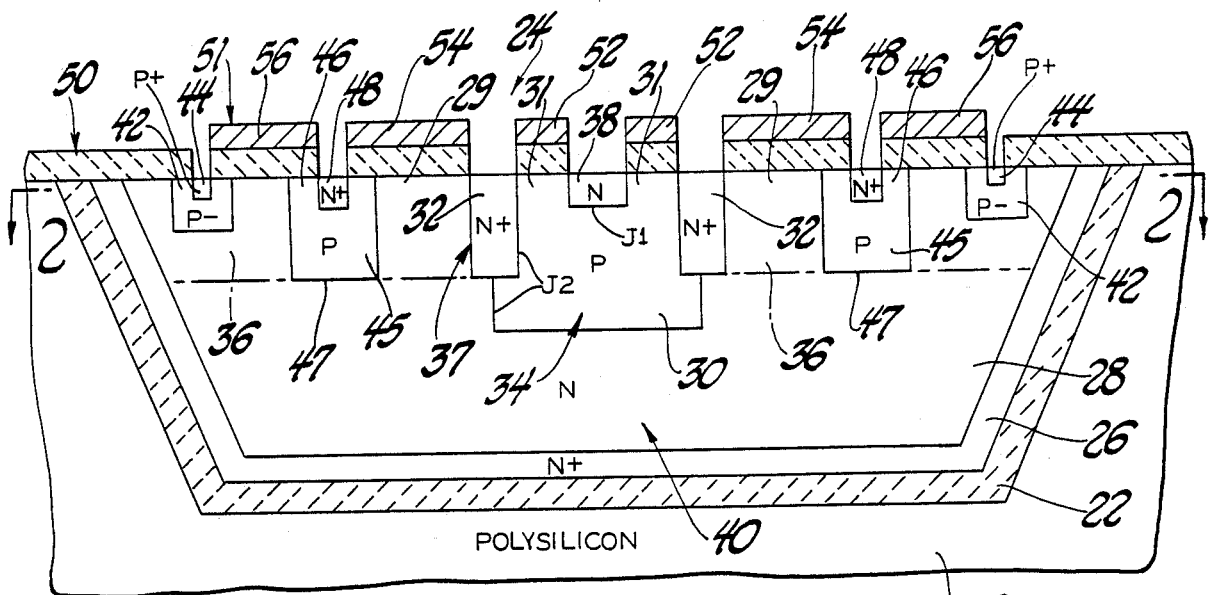
FIG. 1 shows a cross-sectional view of a thyristor made in accordance with this invention in an intermediate form of fabrication and shown along the line 1—1 of FIG. 2.
Figure 2:
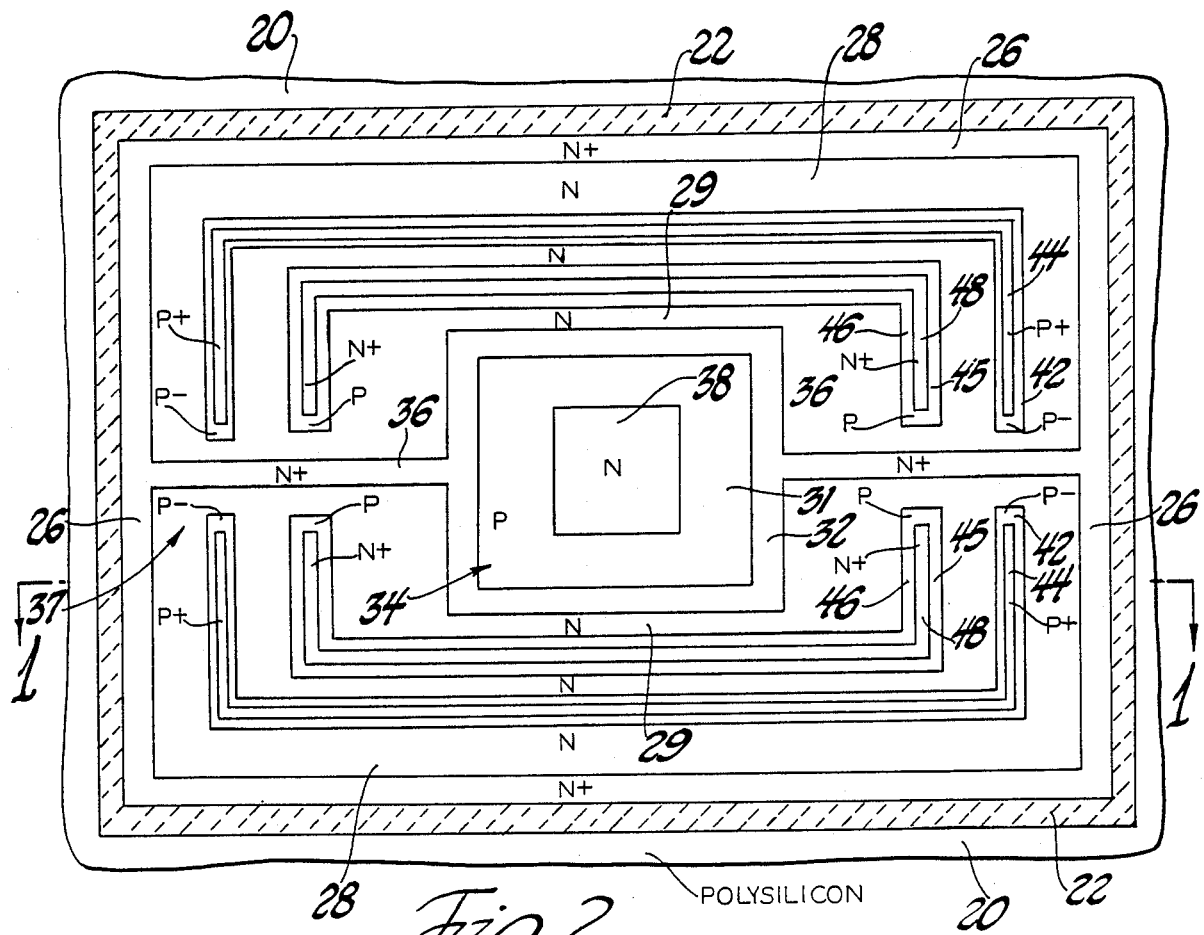
FIG. 2 shows a plan view of a thyristor made in accordance with the present invention and shown along the line 2—2 of FIG. 1.

In accordance with the present invention and referring to FIGS. 1 and 2 of the drawings, one embodiment of my invention includes polysilicon substrate 20 through which buried dielectric layer 22 partially extends. Buried dielectric layer 22 defines electrically isolated thyristor cell 24. By electrically isolating my thyristor from the surrounding material, integration with other devices such as control and logic elements in a single chip is made possible. As will be explained more fully, many electrically isolated cells 24 can be fabricated simultaneously such that control and logic devices can be constructed along with the novel thyristor in a single film.

Disposed over dielectric layer 22 is a layer of highly doped semiconductor material which forms low resistivity buried layer 26. Thyristor cell 24 further includes thyristor body 28 which is formed of semiconductor material of the same conductivity-type as layer 26 but more highly electrically resistive, for example N− material in a device having an N+ type layer 26. Thyrister body 28 has an included region 29 having the same conductivity type and dopant density as thyristor body 28. As with all of the materials suitable for use herein, the semiconductive layers should be of microelectronic device grade purity.

Centrally disposed in the surface of thyrister body 28, is an island-like region of semiconductor material 30 having a channel portion 31. Island 30 and channel portion 31 are formed of semiconductor material having a conductivity type opposite that of region 28, e.g. P-type material in a device having an N− type region 28. Island 30 lies wholly within the perimeter of thyristor body 28 and extends downwardly toward, but is spaced apart from, low resistivity buried layer 26. Island 30 is encircled by a ring 32 of heavily doped semiconductor material which extends laterally outward, partially into region 28 and laterally inward, partially into island 30, as best seen in FIG. 1. The depth of ring 32 defines the portion of island 30 in which lateral pinch resistance occurs, referred to as current-flow constraining portion 34. Ring 32 is formed of semiconductor material having the same conductivity-type as low resistivity buried layer 26 and its depth along with other factors determines the blocking voltage and turn-off characteristics of the thyristor.

As seen in FIG. 2, ring 32 is electrically linked to buried layer 26 by strips 36 of low resistivity material having the same conductivity-type as ring 32 and buried layer 26, N+ type in this embodiment. Strips 36 extend laterally along the surface of thyristor body 28 and electrically connect ring 32 with buried layer 26. The interconnection of these three structures, i.e. buried layer 26, ring 32 and strips 36, forms a unitary low resistivity structure 37 which electrically "floats" in the present invention. That is, it has no direct terminal contact and "floats" in accordance with electrical potentials applied to adjacent regions.

Disposed centrally within island 30 is a smaller, shallower region of semiconductor material having a conductivity type opposite that of island 30, which defines a thyristor cathode 38. In FIG. 1, cathode 38 is shown as a single region disposed wholly within island 30. The metallurgical junction formed at the interface of cathode 38 and island 30 is a pn junction referred to as J1.

Figure 3:
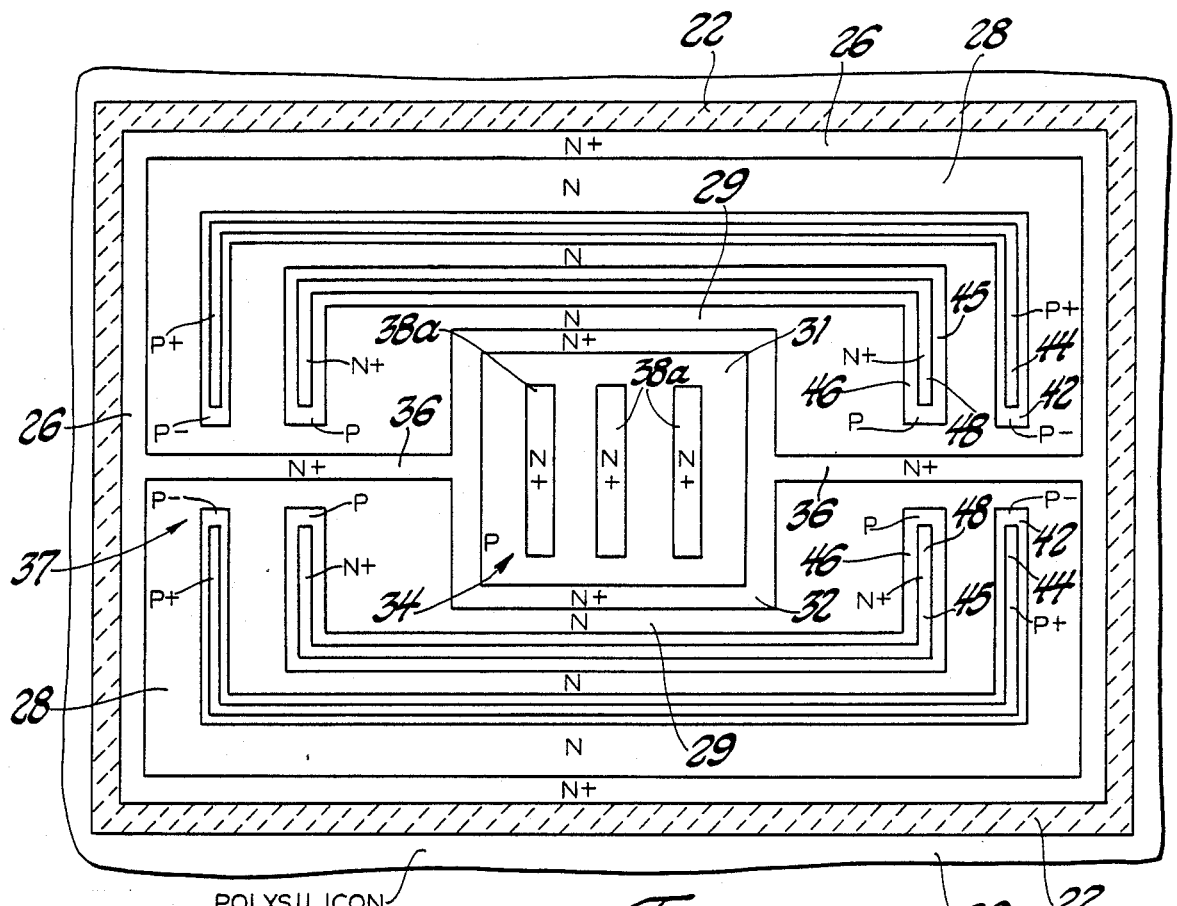
FIG. 3 shows a plan view of a modification of the thyristor shown in FIGS. 1 and 2 in an intermediate fabrication stage.

In an alternative embodiment shown in FIG. 3, cathode 38 is designed as a series of rectangular strips 38a. Dividing the cathode 38 into several separate portions increases its injection efficiency due to the fact that the emitter edge is greatly increased. Hence, by forming an array of cathodes and connecting them in parallel with metallization, a large emitter edge can be obtained utilizing very little silicon. This, as will be seen, allows for a greater shunt resistance if desired and also reduces field line cramping which interferes with injection efficiency. The interface of island 30 with thyristor body 28 and ring 32 forms a single continuous pn junction, J2, as indicated in FIG. 1.

As previously stated, ring 32 encircles current flow constraining portion 34 of island 30. A lateral depletion region produced at the junction of ring 32 and island 30 constrains the flow of hole current through portion 34 and this lateral pinch resistance comprises one part of the turn-off mechanism of my device. The current constraining depletion region extends laterally from the inner perimeter of ring 32 into current flow constraining portion 34. When the thyristor is in the forward conducting state, hole current must flow through constraining portion 34 to reach cathode 38. Hence, the current can be pinched off in portion 34 by depleting its hole concentration with ring 32. In addition to this lateral pinch resistance, turn-off of my thyrister is further obtained by restricting current flow through a second current constraining portion 40 located in thyristor body 28 between island 30 and buried layer 26. As will be explained more fully herein, current flow through current constraining portion 40 is restricted by a vertical pinch resistance produced between two opposed fields during turn-off. The first of these vertical fields originates at junction J2. The second field is produced at the junction of buried layer 26 and thyristor body 28. When the device is operated in the forward-conducting state thyristor body 28 is highly modulated with holes and electrons. During device turn-off a current constraining field effect is produced at the interface of this highly modulated region 28 with buried layer 26, again, by depleting the hole concentration.

Disposed near the perimeter of region 28 is anode 42 which, as shown in FIG. 2, consists of two generally U-shaped regions, respectively on opposite sides of centrally disposed island 30. Fundamentally, anode 42 could be a single ring of material encircling region 30, however, in this particular embodiment of my invention it is divided into two halves by strips 36 from which the ends of each section of anode 42 are spaced apart. As seen in FIG. 1, anode 42 is disposed in the surface of thyristor body 28 and has a conductivity type opposite that of thyristor body 28, P-type in this example. A smaller, shallow, included region 44 of low resistivity material is disposed in anode 42 to better establish low electrical resistance contact between anode 42 and subsequent contact metalization. In this example anode 42 and region 44 are P− type material. The metallurgical junction at the interface of anode 42 and body 28 is referred to as J3.

Similar in shape to anode 42 is anode IGFET channel 45 having integral portion 46 at the surface of thyristor body 28. As seen in FIG. 2, anode IGFET channel 45 comprises two U-shaped sections of semiconductor material disposed in the surface of region 28 between and spaced apart from anode 42 and ring 32. Anode IGFET channel 45 forms a pn junction 47 with region 28. The ends of each section of anode IGFET channel 45 are spaced apart from strips 34 similar to the arrangement of anode 42. Anode IGFET channel 45 is formed of semiconductor material having a conductivity type opposite that of thyristor body 28. As seen in FIG. 1, channel 45 extends downwardly partially into thyristor body 28. Disposed wholly within anode IGFET channel 45 is anode IGFET drain 48 which has the same shape as anode IGFET channel 45. Anode IGFET drain 48 is formed of semiconductor material having the same conductivity type as region 28 but more heavily doped.

A layer of silicon dioxide 50 (not shown in FIGS. 2 and 3) is disposed over electrically isolated cell 24. The various device structures are accessed through contact vias opened in oxide layer 50 and subsequent layers. Furthermore, oxide layer 50 serves as a dielectric layer for the thyristor IGFET structures. An electrode layer 51 (not shown in FIGS. 2 and 3), here, polysilicon, is disposed over oxide layer 50. That portion of electrode layer 51 which lies between the inner perimeter of ring 32 and the outer perimeter of cathode 38 forms gate electrode 52 which is used to turn the thyristor on.

Disposed over oxide layer 50 and positioned between anode IGFET drain 48 and the outer perimeter of ring 32 there is provided another gate electrode 54 which forms the gate used to turn my thyristor off. Gate electrodes 52 and 54 should register well with the device regions which they will capacitively interconnect during operation. A field plate 56 is provided overlying oxide layer 50 between anode 42 and anode IGFET drain 48. Field plate 56 helps prevent voltage breakdown caused by an excess concentration of fields.

The surface of cell 24 with overlying oxide layers 50 and electrode layer 51 is covered by a layer of phosphosilicate glass (not shown) in which contact windows are provided to access the device structures. A metallization layer (not shown) is applied and patterned to provide separate metal contacts for cathode 38, anode 42, gate electrode 52, and gate electrode 54. Thus, this embodiment of my invention is presented as a four terminal device with anode 42 linked to anode IGFET drain 48. In typical automotive applications cathode 38 would be grounded.

Figure 4:
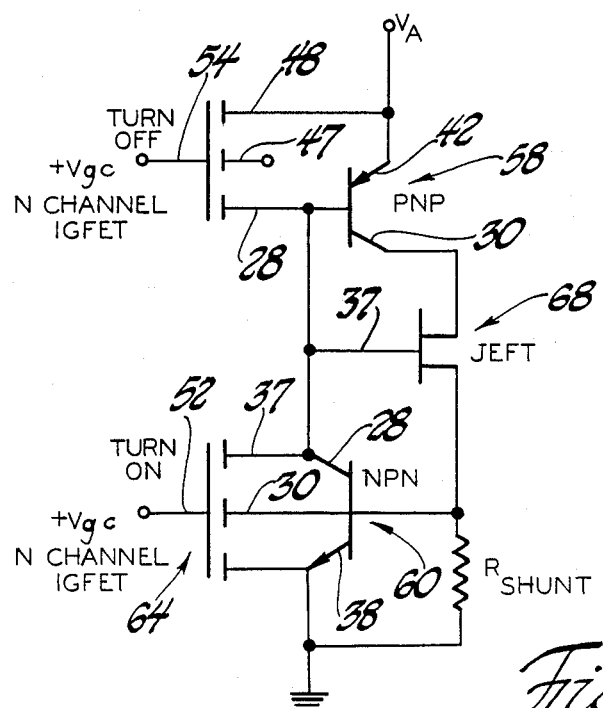
FIG. 4 shows an electrical schematic of the thyristor on this invention.

Referring now to FIGS. 1 and 2 and particularly to FIG. 4 which generally depicts the present invention schematically, my lateral dual gate thyristor provides a pnp transistor 58 in which anode 42 is the pnp emitter, island 30 is the collector, and unitary floating structure 37 along with thyristor body 28 serves as the pnp base. There is further provided an npn transistor 60 for which it can be considered that cathode 38 is the emitter, island 30 is the base and unitary floating structure 37 along with thyristor body 28 is the virtual collector. The collector is "virtual" because it is not directly connected to a terminal. Therefore, it will be recognized that junctions J2 and J3 form pnp transistor 58 and junctions J1 and J2 form npn transistor 60. There is also provided a resistance, $R_{shunt}$, which is the internal resistance of island 30 between cathode 38 and ring 32. $R_{shunt}$ has a value which is related to the characteristics of the turn-on IGFET which is indicated by reference numeral 64 in FIG. 4. Similarly, I indicate the thyristor turn-off IGFET in FIG. 4 with reference numeral 66. The action of ring 32 in constraining current flow through current flow constraining portion 34 by producing a junction field effect during device turn-off is depicted schematically in FIG. 4 as JFET 68 which is the internal vertical pinch resistance of the device. As depicted, cathode 38 is grounded and both turn-on IGFET 64 and turn-off IGFET 66 are connected to a positive voltage source as would be the case in automotive applications. Turn-on IGFET 64 is electrically in parallel with npn transistor 60. Turn-off IGFET 66 is electrically in parallel with pnp transistor 58.

Turn-on IGFET 64 and turn-off IGFET 66 are the control gates of my novel lateral dual-gate thyristor.

Although thyristors are known in which device turn-on is controlled by an insulated gate structure, my lateral thyristor does not require that current density by decreased to effectuate device turn-off. Turn-off is achieved by turn-off IGFET 66 is part through lateral and vertical pinch resistances produced in current-flow constraining portions 34 and 40, respectively.

In operation, anode 42 is connected at region 44 to a source of positive electrical potential relative to cathode 38, which would be ground potential in automotive applications. Turn-on of my thyristor is then brought about by turn-on IGFET 64. With reference to FIG. 1, turn-on IGFET 64 includes cathode 38 as a source region, ring 32 as a drain region and portion 31 of island 30 as the IGFET channel. Thus, in this embodiment of the invention island 30 is formed of p-type material and both cathode 38 and ring 32 are n-type material so that turn-on IGFET 64 is an n-channel device. Similarly, turn-off IGFET is an n-channel device which includes anode IGFET drain 48, anode IGFET channel 45 and a source region comprised of thyristor body 28 and unitary floating structure 37. Electrode 52 forms the gate electrode for turn-on IGFET 64 and electrode 54 forms the gate electrode for tune-off IGFET 66. Therefore, my lateral thyristor includes, in this embodiment, two n-channel IGFETS, one of which functions to turn the device on, and the other to turn it off.

The present invention is in the forward blocking state when gate electrodes 52 and 54 are both at zero voltage. To turn the device on, a positive potential is applied to gate electrode 52 to activate turn-on IGFET 64. An inversion layer in channel portion 31 of island 30 is thereby produced, electrically linking cathode 38 with ring 32. Unitary floating structure 37 thus approaches cathode potential. Since anode 42 is at a higher positive potential than cathode 38, which is at ground in this example, electrons flow from cathode 38 to unitary floating structure 37 and then through thyristor body 28 to anode 42. The electrical potential of unitary floating structure 37 and thyristor body 28 are lowered and emitter-base junction J3 of pnp transistor 58 is placed in forward bias, turning on pnp transistor 58. This action provides holes for injection across emitter-base Junction J1 into island 30 which serves as the base of npn transistor 60. Junction J1 is already forward biased and this supply of hole current provides base drive to npn transistor 60, tending to turn it on. Note that the voltage drop across shunt resistance 62 allows npn transistor 60 and junction J1 to be forward biased. As current increases, the current gain alpha of pnp transistor 58 and npn transistor 60 increases. Regenerative switching to a low voltage, high current state occurs when the sum of the two alphas exceeds one, as is known. Pnp transistor 58 and npn transistor 60 are then latched. The voltage applied to gate electrode 52 can be discontinued but regenerative switching action will continue. The resistivity of thyristor body 28 drops considerably during regenerative switching due to the high concentration of electrons and holes which gives rise to the high current handling capability of this device. A number of factors affect thyristor turn-on time including the geometry of turn-on IGFET 64, device temperature as well as the amplitude and rise time of the gate voltage and current.

It should be apparent, then, that the thyristor can not be turned off merely by removing the on gate voltage at turn-on IGFET 64. Once latched, regenerative switching continues independent of the IGFET 64 positive gate potential. Without further electrical intervention, conduction will continue as long as the anode-cathode voltage difference is large enough to produce injection across the emitter-base junction of pnp transistor 58 and/or npn transistor 60. While some conventional thyristors rely on the application of a negative potential to a control gate in order to achieve thyristor turn-off, thyristor turn-off can be achieved in the present invention without decreasing the anode-cathode potential difference and without applying a negative voltage bias to a control gate. In my device, turn-off can be brought about by applying a positive voltage to gate electrode 54.

Turn-off is obtained in the following manner. First, the positive voltage on gate electrode 52 is removed so that the flow of electrons through channel portion 31 of island 30 stops, in effect turning off IGFET 66. Next, IGFET 64 is turned on by applying a positive voltage to gate electrode 54. As stated, IGFET 66 is the turn-off control gate. By applying a positive voltage to gate electrode 54 which is greater then the channel threshold value, an inversion layer is produced in portion 46 of anode IGFET channel region 46 and, similarly, channel portion 29 of thyristor body 28 is made highly conductive. This N-type conductive channel electrically links anode IGFET drain 48 with ring 32.

It should be pointed out that while my lateral dual gate thyristor is generally depicted as a four terminal device, that is, separate electrical contacts are provided only to anode 42, cathode 38, gate electrode 52 and gate electrode 54, anode IGFET drain 48 is shorted to anode 42 simply to provide a convenient source of positive potential. It is suitable, however, to provide a separate electrical contact to anode IGFET drain 48 to access a separate source of positive potential which can be designated as $V_{DD}$ instead of shorting it to anode 42. This may be desirable in some applications. For example, a separate contact to anode IGFET drain 48 may be preferred in order to reduce the magnitude of the control voltage necessary to achieve rapid turn-off. If the anode voltage is 80 volts, a $V_{DD}$ potential of approximately 5 to 15 volts can by used, wherein a voltage of only 5 to 15 volts on gate electrode 54 will turn the thyristor off. This is less than the voltage which would be required on gate electrode 54 for turn-off where anode IGFET drain 48 is shorted to anode 42. I have shown the shorted anode configuration in the electrical schematic of FIG. 4.

Thus, when a positive voltage is applied to gate electrode 54 a highly conductive path is produced which provides a parallel bridge around the base of pnp transistor 58 directly to anode 42. This low resistance path is also electrically in parallel with base-emitter junction J3 of pnp transistor 58. Hence, the forward bias of the emitter-base junction J3 of pnp transistor 58 is decreased which reduces hole injection across J3. Accordingly, hole current flow through pnp transistor 58 is reduced which tends to turn off npn transistor 60 by reducing its base drive.

Moreover, since turn off IGFET 66 also produces a low resistance path across thyristor body 28 at portion 29, as stated anode IGFET drain 48 and unitary floating structure 37 are electrically linked. This low resistance path is brought about capacitively by electrode 54 which when positively charged draws mobile electrons from the bulk of thyristor body 28 to portion 29. Thus an $N_+$ type channel is produced across the $N^-$ type thyristor body 28. Recalling that ring 32 as well as all of unitary floating structure 37 electrically floats, when turn-off IGFET 66 is in the conducting state, unitary floating structure is brought to the same electrical potential as anode 42 or to $V_{DD}$ in my alternative five terminal embodiment. This produces two very important electrical field effects which help bring about rapid turn-off in my novel lateral thyristor.

As the electrical potential of ring 32 approaches that of anode 42, junction J2 becomes reverse biased. Reverse biased junction J2 produces a space charge region which extends into island 30 at current flow constraining portion 34. It should be apparent that when the thyristor is in the forward conducting state hole flow from anode 42 passes through island 30 to cathode 38 by moving through current flow constraining portion 34. Since current flow constraining portion 34 is encircled by ring 32, hole flow is normal to the electric field produced by reversed biased junction J2. As the space charge region penetrates more deeply into current flow constraining portion 34, hole flow is restricted or "pinched off" by a lateral pinch resistance which reduces the cross-sectional area through holes flow. In effect, ring 28 acts like a junction field effect transistor gate. Hence in the electrical schematic of FIG. 4, this lateral pinch is shown as a JFET 68. Accordingly, its source and drain would be the upper and lower regions of island 30, respectively.

In addition to the lateral pinch resistance provided by JFET 68, a second, vertical, pinch resistance is provided which further compliments rapid turn-off of my thyristor. It will be appreciated that thyristor body 28 is highly modulated during regenerative switching, having a high density of both holes and free electrons. It will also be recognized that the space charge region produced by reversed biased pn junction J2 extends into thyristor body 28 at its interface with island 30. This is because the electrical potential of thyristor body 28 also approaches the potential of anode 42 or, alternatively, $V_{DD}$, since thyristor body 28 is in electrical contact with unitary floating structure 37. Therefore, a space charge region emanates from reverse biased junction J2 and extends into second current flow constraining portion 40, which is the region of thyristor body 28 disposed between island 30 and buried layer 26 at their nearest surfaces. An additional field effect is produced at the interface of buried layer 26 and the highly modulated thyristor body 28 which also projects into second current flow constraining portion 40, but from the opposite direction than the field produced at junction J2. Therefore, hole current passing through second current flow constraining portion 40 is pinched off or constrained between these two vertical. opposed fields which penetrate second current flow constraining portion 40. Hence, my lateral dual gate thyristor achieves turn-off in part by two pinch resistances in two regions to produce a decrease in conductivity modulation of thyristor body 28, reestablishing the nonregenerative state.

In order to enhance the turn-off efficiency of the lateral pinch resistance, the diameter of current flow constraining portion 34 should be small enough such that the space charge region produced by the reverse biased junction at the interface of ring 28 and island 30 can completely penetrate portion 34. That is, the inner diameter of ring 32 should be small enough to effectively pinch-off hole current through portion 34 in accordance with the thyristor voltage and current requirements. It should be recognized that ring 32 could be any shape which provides a pinch effect generally normal to the direction of current flow in the device.

Analogously, the vertical pinch resistance which takes place in second current-flow constraining portion 40 can be optimized by reducing the distance between island 30 and buried layer 26. In other words, by minimizing the thickness of thyristor body 28 at second current flow constraining portion 34, greater current flow restriction can be obtained. However, the relative dimensions of these regions must be consistent with the desired electrical parameters of the device. For automotive applications, it is preferred that the inner diameter of ring 32 at current-flow constraining portion 34 be from about 10 to about 30 micrometers and that the distance between island-like region 30 and buried layer 26 through second current flow constraining portion 40 be from about 5 to about 10 micrometers. This spacing is based on achieving a blocking capability of about 80 volts or higher on the anode. Also, the function of turn-off IGFET 66 is to provide a positive voltage to unitary floating structure 37. Other IGFET structures and other means for achieving this positive potential may be suitable for producing the necessary turn-off potential.

By merely increasing the voltages applied to anode 42 and cathode 38, regenerative switching can be instituted in my thyristor as in conventional thyristors. However, in my thyristor, anode 42 is shielded from the cathode 38 by the lateral pinch resistance of ring 32 when ring 32 is appropriately biased. Therefore, by maintaining a positive voltage on electrode 54 of turn-off IGFET 66, the present thyristor can withstand greater anode-cathode voltages without initiating thyristor turn-on. Accordingly, it may be preferable to maintain a positive voltage on electrode 54 until such time that thyristor turn-on is desired. This would help prevent unintended turn-on which can occur as a result of a significant increase in temperature or a rapid voltage rise on the anode.

It will be recognized that field plate 56 controls the break down characteristics of the underlying pn junctions by modifying the electric field lines. While field plate 56 could be electrically biased, the existing work function of the materials is sufficient to reduce the concentration of fields at junction curvatures. Presumably pn junctions J1 and J3 could be Schottky barriers in as much as J1 and J3 do not have to withstand high voltages. Schottky barriers would provide a lower forward voltage drop than diffused pn junctions and thus they may be preferred for used herein.

Furthermore, anode 42 could be shorted to thyristor body 28 to control the gain of the pnp transistor. Analogously, cathode 38 could be shorted to island 30. However, these regions should preferably not be shorted under the insulated gate structures. It will also be recognized that I have described this embodiment of my invention as an enhancement mode device. This is because IGFETS 66 and 68 are as stated enhancement mode transistors. They could easily be made as depletion mode IGFETS by forming a shallow N-type layer in their respective channels. Or alternatively, one IGFET could be an enhancement mode device while this is a depletion mode device, of course, depletion mode IGFETS would require a negative voltage source, which may be available in some applications.

The fabrication sequence for producing the present invention begins with a wafer of high resistivity $N^-$ or $P^-$ (100) monocrystalline silicon. It may be possible and desirable in some applications to use other semiconductor materials and their use is intended to come within the scope of the present invention. It may also be possible to fabricate the present invention as a silicon-on-insulator device. While the voltage requirements of the device dictate the resistivity of the wafer, a 5 to 20 ohm-cm silicon wafer is suitable for many applications. Because my novel lateral thyristor structure can be integrated with control and logic structures in a single chip, the conductivity-type of the wafer can be selected accordingly. A P-type wafer would be useful in fabricating NMOS circuits integrated with the present invention. An N-type wafer would be useful for integrating CMOS with my lateral thyristor and an $N^-$ wafer is used in this example.

First, one surface of the wafer is etched to form cells of silicon which are separated by generally V or U shaped grooves. The shape of the grooves is not critical to the invention. Etching the grooves is most conveniently done using conventional masking techniques and an antisotropic etchant, although other techniques such as reactive ion beam etching or the like may be suitable. Using an anisotropic etchant, the depth of the groove is determined by the width of the etch window, a wider window producing a deeper groove. The grooves are preferably from about 20 to 100 micrometers deep.

Next, an $N^+$ layer is formed on the grooved face of the wafer by a blanket diffusion of a donor impurity such as phosphorous. The depth of this $N^+$ layer is determined by the desired electrical characteristics of the thyristor, specifically its voltage capability and turn-off voltage gain. The $N^-$ layer may or may not be needed for other devices in adjoining cells. During this blanket diffusion, both the side walls and the apex of each groove are rendered $N^-$ type material. That is, the $N^+$ layer extends uninterrupted across the silicon cells and down into each groove. This $N^+$ layer will become buried layer 26 in the completed device. Other doping techniques, such as ion implantation could be used to form the $N^+$ layer. The grooved and now heavily doped wafer surface is oxidized to form a layer of dielectric which will ultimately become buried dielectric layer 22 which insulates electrically isolated regions 24 from each other. For most purposes, a dielectric layer approximately 1 to 4 micrometers thick would be sufficient. The dielectric layer can be formed simply by placing the wafer in an oxidation furnace after it has been grooved and doped. However, since oxidation causes a certain amount of volume expansion and stress, I prefer the following alternative method. First, a layer of undoped polysilicon is formed on the grooved surface of the wafer such that the polysilicon layer completely overlies the $N^+$ layer, including the sidewall doping. The polysilicon layer should be about one-half the thickness of the required dielectric thickness, about 0.5 to 2 micrometers. The wafer is then oxidized to form a dielectric layer of the desired thickness. When silicon is oxidized, only one-half of the final oxide thickness is consumed in silicon. Hence, when the polysilicon coated wafer is oxidized, only the polysilicon layer will be consumed in forming the dielectric layer. Very little if any of the $N^+$ layer will be consumed. As a result, the number of stress induced dislocations will be reduced which reduces current leakage.

Next, a thick layer of polysilicon is deposited on the grooved substrate surface such that the grooves are completely filled with polysilicon. This is polysilicon substrate 20 which gives the grooved wafer mechanical strength. Polysilicon substrate 20 should be from about 250 to 500 micrometers thick. The surface of polysilicon substrate 20 is then ground flat, still preserving a thickness of about 250 to 500 micrometers.

In order to form the network of electrically isolated regions 24, the wafer is inverted and the monocrystalline material is polished beyond the apices of the grooves. That is, the wafer is inverted so that the polysilicon substrate is on the bottom and the tips of the grooves extend upwardly in the wafer. The wafer is then polished to remove monocrystalline silicon to a depth such that the apices or "tips" of the grooves are ground off. In order to determine when a sufficient amount of semiconductor material has been removed, a junction staining technique can be used. It will be noted that if a P-type wafer is used in the fabrication process the $N^+$ layer which covers the groove sidewalls forms a PN junction at the groove apex. By using one of several commercially available junction stains in the polishing process, the end point of the polishing process can be accurately determined. It is of course the object of the polishing to sever the electrical interconnection of isolated regions 24 which is provided by the silicon wafer and buried $N^+$ layer. By using a P-type substrate wafer as a monitor, the end point of N-type wafers can be determined since in electrochemical polishing material from both wafers is removed at an approximately equal rate. Having obtained multiple electrically isolated cells, island 30 is formed in one or more regions 24 by forming a layer of silicon dioxide over the surface of electrically isolated region 24, cutting a diffusion window in the oxide layer and diffusing or implanting a P-type dopant, such as boron, through the window. The shape of island 30 is not critical but its depth determines the blocking voltage of the device. For most automotive applications, island 30 should have a length of about 10 to 30 micrometers, a width of about 10 to about 30 micrometers, a dopant density of from about $1 \times 10^{15}$ to $\times 10^{16}$ dopant atoms per cubic centimeter and a depth of about 5 to 15 micrometers.

Once island 30 has been formed, the diffusion window is closed by another oxide growth. The oxide layer is then patterned and etched using standard photolithography and etching techniques to form a diffusion mask in the shape of ring 32. Optionally, cathode 38 which is also an $N^+$ diffusion can be formed during this processing step by simply opening a small window in the oxide layer at the center of the oxide which is circumscribed by the diffusion window for ring 32. For better blocking capability in the reverse direction, as would be the case when cathode 38 goes negative, cathode 38 should be deep. By forming cathode 38 early in the process sequence, a deep diffusion can be assured. As stated, ring 32 can be virtually any configuration such as a rectangle, square, circle or an irregular ring shape. The diffusion profile of $N^+$ ring 32 determines the blocking voltage and turn-off characteristics of the device. Although the dimensions are not critical, ring 32, if formed in the shape of a rectangle, should have a length of about 15 to 40 micrometers, and a width of 15 to 40 micrometers, as measured from its outer perimeter. Ring 32 should have a depth of about 2 to 10 micrometers. As with all doping operations carried out during fabrication of this invention, it is suitable to use other doping techniques such as ion implantation to achieve the required dopant densities and reference to diffusion or implant window is arbitrary. Any N-type dopant such as phosphorous is suitable for use herein. A dopant density of about $1 \times 10^{17}$ to $1 \times 10^{19}$ dopant atoms per cubic centimeter for ring 32 and from about $1 \times 10^{18}$ to $1 \times 10^{19}$ dopant atoms per cubic centimeter for cathode 38 is preferred. N+ strips 36 are also formed at this time by cutting windows in the oxide which extend from the edges of ring 32 to N+ buried layer 26 and using the patterned oxide as a diffusion or implant mask. The N+ strips serve to electrically connect ring 32 and buried layer 26. They have a depth of from about 2 to 10 micrometers, a width of from 3 to 10 micrometers, and a dopant density of from about $1 \times 10^{17}$ to $1 \times 10^{19}$ dopant atoms per cubic centimeter.

After ring 32, strips 36 and, optionally, cathode 38 have been formed, two concentric P-type diffusions or implants are performed to make anode 42 and anode IGFET channel region 45. The anode diffusion should be from about 5 to 15 micrometers wide and have a depth of from about 5 to 15 micrometers. The anode IGEFT channel region 45 is from about 5 to 15 micrometers wide and has a depth of about 5 to 15 micrometers. The diffusion windows for these two structures are formed using conventional photolithographic and etching techniques. Following this diffusion, a layer of oxide is grown over the diffusion windows and smaller windows are opened above anode 42 to form heavily doped anode contact region 44. This completes the anode diffusion.

The oxide layer 50 is then grown over the wafer using conventional techniques to a thickness of about 0.2 to 0.5 micrometers. A layer of polysilicon, approximately 0.3 to 0.5 micrometers thick, is deposited over oxide layer 50. Oxide layer 50 and the overlying polysilicon layer 51 are patterened to open windows above anode IGFET channel region 45 to form anode IGFET region 48. If cathode 38 was not previously formed, it is formed now along with anode IGFET region 48. A blanket implant of phosphorous can be used to dope polysilicon layer 51, anode IGFET drain region 48, and as stated, optionally, cathode 38. Although I have shown cathode 38 as a single structure in FIGS. 1 and 2, I prefer to form cathode 38 as an array of strips as shown in FIG. 3 to increase the injection efficiency of the NPN transistor. The individual cathode strips can be electrically interconnected by appropriate metallization. Contact windows are then opened in the doped polysilicon layer and oxide layer 50 above ring 32 and anode contact region 44. This forms gate electrodes 52 and 54 for turn-off IGEFT 64 turn-off IGFET 66, respectively, and field plate 56.

Finally, the device is coated with phosphosilicate glass (not shown), contact windows are opened, and the appropriate metalization is applied and etched.

What is claimed is:

1. A method for forming a semiconductor power device comprising the steps of:
    (A) forming an electrically isolated region of semiconductor material in a substrate, said isolated region having a first conductivity type;
    (B) forming a buried layer of highly conductive semiconductor material is said electrically isolated region;
    (C) forming a highly conductive ring in said isolated region;
    (D) introducing dopant impurities into a region within said ring to form an island having second conductivity type;
    (E) forming strips of highly conductive semiconductor material at the surface of said electrically isolated region, said strips having said first conductivity type and electrically linking said ring and said highly conductive buried layer;
    (F) forming a heavily doped cathode region within said island, by said cathode region having said first conductivity type;
    (G) forming an anode region within said isolated region;
    (H) doping a portion of said isolated region between said ring and said anode to form a channel having said second conductivity type;
    (I) forming a drain region within said channel at the surface of said isolated region;
    (J) forming a layer of dielectric over the surface of said isolated region;
    (K) depositing a layer of electrode material over said layer of said dielectric material; and
    (L) etching said electrode layer and said dielectric material to define contact windows respectively above said cathode, ring, drain and anode to define a first insulated gate electrode registering with a portion of said island and to define a second insulated gate electrode registering with a portion of said isolated region.

2. The method of forming a semiconductor power device recited in claim 1, including the steps of forming a layer of electrically insulative material on said dielectric layer and said first and second insulated gate electrodes, opening contact windows in said electrically insulative material, and depositing a metalization layer on said electrically insulative layer.

3. The method of forming a semiconductor power device recited in claim 2, including the step of etching said metalization layer to form separate metal contacts for said cathode, anode, first insulated gate electrode and second insulated gate electrode.

4. The method of forming a semiconductor power device recited in claim 3, including the step of etching and metalization to form a separate metal contact for said drain.

5. The method of forming a semiconductor power device recited in claim 1, including the step of electrically shorting said cathode to said island.

6. The method of forming a semiconductor power device recited in claim 1, including the step of electrically shorting said anode to said electrically isolated semiconductor region.

7. The method of forming a semiconductor power device recited in claim 1, wherein said steps (A) and (B) are each performed by:
    etching at least two grooves in the surface of a semiconductor wafer to form a cell;
    forming a highly conductive layer of semiconductor material over the surface of said cell and over the sidewalls of said grooves;
    forming a layer of buried insulative material on said highly conductive layer;
    depositing a film of polysilicon over said grooved wafer surface, thereby filling said grooves with polysilicon;
    removing semiconductor material from the side of said wafer opposite the side of said wafer which includes said grooved surface to a depth such that the apices of said grooves are removed and said electrically isolated semiconductor region is electrically insulative from said polysilicon by said buried insulative material.

8. The method of forming a semiconductor power device recited in claim 7, wherein said buried insulative material is a layer of silicon dioxide formed by depositing a thin layer of conductive buried layer and oxidizing said thin polysilicon layer to form said buried insulative material.

* * * * *